United States Patent [19]

Yamamoto et al.

[11] Patent Number: 4,485,325

[45] Date of Patent: Nov. 27, 1984

[54] HOUSING AND MOUNTING FOR A CHIP-LIKE PIEZOELECTRIC VIBRATOR COMPONENT

[75] Inventors: Takashi Yamamoto, Oshimizu; Houdo Kitajima, Takaoka, both of Japan

[73] Assignee: Murata Manufacturing Co., Ltd., Japan

[21] Appl. No.: 468,478

[22] Filed: Feb. 22, 1983

[30] Foreign Application Priority Data

Mar. 4, 1982 [JP] Japan .............................. 57-31693[U]
Nov. 11, 1982 [JP] Japan .................. 57-198493

[51] Int. Cl.³ ............................................ H01L 41/08
[52] U.S. Cl. .................................. 310/344; 310/348; 310/356; 310/320
[58] Field of Search ................ 310/344, 348, 351-356, 310/320

[56] References Cited

U.S. PATENT DOCUMENTS

| | | | |
|---|---|---|---|
| 2,341,683 | 2/1944 | Bailey | 310/356 |
| 2,395,034 | 2/1946 | Bokovoy | 310/356 |
| 4,145,627 | 3/1979 | Ishizawa | 310/353 X |

FOREIGN PATENT DOCUMENTS 48120 4/1981 Japan .

*Primary Examiner*—Mark O. Budd
*Attorney, Agent, or Firm*—Ostrolenk, Faber, Gerb & Soffen

[57] ABSTRACT

A chip-like piezoelectric vibrator component is disclosed. The component includes an axially elongated case made of an insulating material, in which an elongated piezoelectric vibrator element is housed. The piezoelectric vibrator element comprises vibrator electrodes formed on opposite main surfaces of a piezoelectric plate, wherein energy is trapped only in the longitudinal direction, whereby thickness sliding vibration is caused. Conductive terminals or caps are fitted into openings at both ends of the case and these are electrically connected to electrodes extending to both ends of the element. Concavities are formed on the conductive terminals or caps at the inner side of the case so that the element may be positioned and held by the concavities, whereby a spacing is secured between the vibrating electrode portions of the element and the inner wall of the case.

5 Claims, 28 Drawing Figures

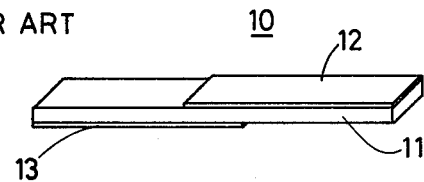
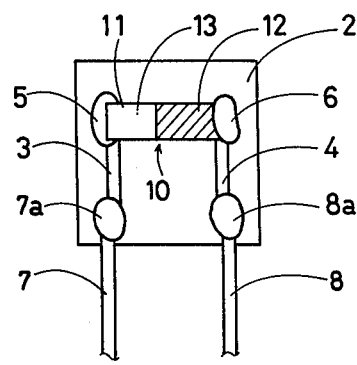
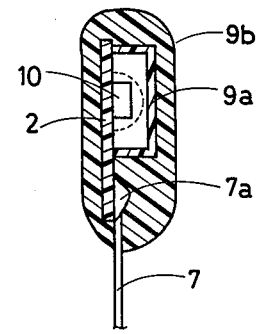
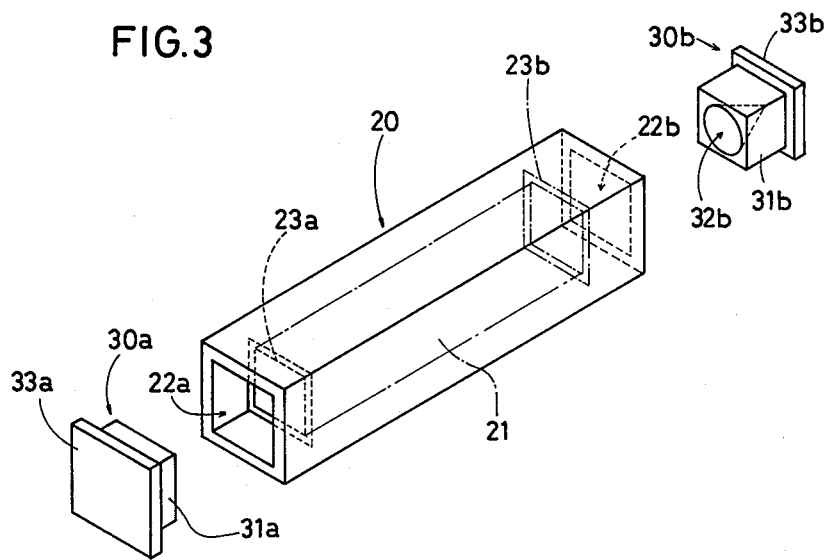

HOUSING AND MOUNTING FOR A CHIP-LIKE PIEZOELECTRIC VIBRATOR COMPONENT

BACKGROUND OF THE INVENTION

1. Field of the Invention

The present invention relates to a chip-like piezoelectric vibrator component. More specifically, the present invention relates to a chip-like piezoelectric vibrator component structured to hold a piezoelectric element in a case.

2. Description of the Prior Art

FIG. 1 is a perspective view showing one example of a piezoelectric vibrator element which constitutes the background of the invention and which can be employed in the present invention. A piezoelectric vibrator element 10 comprises a piezoelectric plate 11 made of, for example, ceramic, which is polarized in the direction along the main surfaces, having opposing vibrator electrodes 11 and 12 formed on both main surfaces of the plate 11. The vibrator electrodes 11 and 12 cooperate with each other to cause, for example, energy trapped type thickness sliding vibration to the piezoelectric plate.

FIGS. 2A and 2B are views showing one example of a conventional piezoelectric vibrator component. First referring to FIG. 2A, a piezoelectric vibrator element 10 is adhered and fixed with conductive paints 5 and 6 onto a printed circuit board 2 having printed circuits 3 and 4. More specifically, the two electrodes 12 and 13 of the piezoelectric vibrator element 10 are electrically connected to the printed circuits 3 and 4 by means of the conductive paints 5 and 6. Furthermore, a lead wire 7 is conductively fixed by a solder 7a to the printed circuit 3 and a lead wire 8 is conductively fixed by a solder 8a to the printed circuit 4. The above described printed circuit board 2 is covered with a cap 9a having a concavity formed therein to cover the piezoelectric vibrator element 10, as shown in FIG. 2B, and a resin layer 9b is formed thereon by dipping. The above described conventional example is disclosed in, for example, Japanese Patent Laying Open Gazette No. 13581/1980 laid opened for public inspection on Jan. 20, 1980.

Meanwhile, the above described conventional structure exhibits the following shortcomings. Initially, the above described conventional structure requires a number of components, which makes the component cost expensive and makes a manufacturing process complicated. Furthermore, a number of junctions implemented with the conductive paints 5 and 6 and solders 7a and 8a degrade reliability. In addition, covering by a resin layer formed by dipping causes an increased diversification of the outer geometry among components.

On the other hand, of late an automatic assembling apparatus has been widely used and components have shown a tendency toward a so-called implementation in chip by dispensing with external terminals and the like. The above described conventional example, however, was not adaptable to such requirement of implementation in chip.

SUMMARY OF THE INVENTION

Accordingly, a principal object of the present invention is to provide a chip-like piezoelectric vibrator component employing thickness sliding vibration.

Another object of the present invention is to provide a chip-like piezoelectric vibrator component having a piezoelectric vibrator element housed in a case.

A further object of the present invention is to provide a chip-like piezoelectric vibrator component wherein at least a vibrating portion of a piezoelectric vibrator element can be adapted not to be in contact with the inner wall of the case.

Briefly described, a chip-like piezoelectric vibrator component in accordance with the present invention is structured such that a piezoelectric vibrator element is housed in a cylindrical case having an opening formed at least at one end thereof, a conductive terminal is mounted to the opening, and the electrodes of the conductive terminal and the piezoelectric vibrator element are electrically connected by a connecting member.

According to the present invention, an implementation of a piezoelectric vibrator component in a chip form can decrease the cost and can shorten time required for manufacture thereof, as compared with the conventional structure. The present invention can also enhance the reliability and make it possible to easily mounting of the inventive component onto another circuit due to the fact that it is small in size.

In a preferred embodiment of the present invention, a positioning portion for holding or positioning a piezoelectric vibrator element is formed on the conductive terminal.

According to the above described preferred embodiment, the piezoelectric vibrator element is housed in a case such that at least the vibrator electrode portion of the piezoelectric vibrator element is spaced apart from the inner wall of the case by the positioning portion and, therefore, the vibrating portion of the piezoelectric vibrator element is prevented from being in contact with the case. Accordingly, there is no increase in resonance resistance and minor spurious vibrations are not generated. As a result, the inventive component can be advantageously used as an oscillator or a frequency discriminator. Furthermore, since the piezoelectric vibrator element is mechanically held by the positioning portion, mechanical stability is further increased.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view of one example of a piezoelectric vibrator element employing thickness sliding vibration which constitutes the background of the present invention;

FIGS. 2A and 2B are views showing one example of a conventional piezoelectric vibrator component;

FIG. 3 is a perspective view of a disassembled state of one embodiment of the present invention, in which a piezoelectric vibrator element is omitted in illustration;

DESCRIPTION OF THE PREFERRED EMBODIMENTS

Figure 4A:
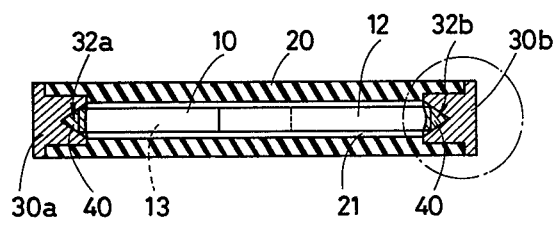
FIG. 4A is a sectional view of the embodiment shown in FIG. 3.

FIG. 3 is a perspective view of a disassembled state of one embodiment of the present invention. It is to be noted that illustration of the piezoelectric vibrator element has been omitted in FIG. 3.

The piezoelectric vibrator element 10 (FIG. 1) is housed in a case 20. In the embodiment shown, the case 20 is formed in the shape of a parallel piped, having a hollow portion 21. If desired, the sectional shape of the case 20 may be circular. The case 20 is made of an electrically insulating material such as ceramics, synthetic resin or the like, for example. Openings 22a and 22b are formed at opposite ends of the case 20 and conductive terminals 30a and 30b, respectively, are fixed thereto.

The conductive terminals 30a and 30b are made of copper or any other metal, for example, and comprise square pillar portions 31a and 31b, respectively, and flange portions 33a and 33b, respectively, extending from one end of each of them. The geometry of the square pillar portions 31a and 31b is selected to be adaptable to the inner geometry of the openings 22a and 22b, respectively, of the case 20. The size of the flange portions 33a and 33b is selected to be adaptable to the size in the transversal direction of the case 20.

Offset portions 23a and 23b are formed on the openings 22a and 22b, respectively, of both ends of the case 22 such that the other ends of the square pillar portions 31a and 31b of the conductive terminals 30a and 30b, respectively, fitted thereinto may abut thereon.

Conical concavities 32a and 32b are formed on the above described other end surfaces of the square pillar portions 31a and 31b of the conductive terminals 30a and 30b, respectively. The concavities 32a and 32b serve as positioning portions for the piezoelectric vibrator element 10. Meanwhile, the concavities may take the shape of a frustum of a cone or a frustum of a pyramid or so on. Corner portions of the piezoelectric plate 11 (FIG. 1) abut the inner peripheral slopes of the concavities 32a and 32b so that the element 10 may be fixed held in the case 20.

Figure 4B:
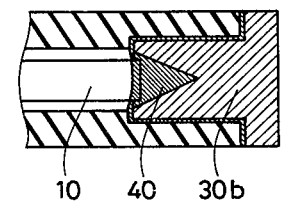
FIG. 4B is an enlarged sectional view of a major portion of the embodiment shown in FIG. 3.

FIG. 4A is a sectional view showing a chip-like piezoelectric vibrator component in accordance with one embodiment of the present invention. FIG. 4B is an enlarged view of the portion encircled with the dotted line in FIG. 4A. Referring to these figures, the structure of the chip-like piezoelectric vibrator component is better understood in which the piezoelectric vibrator element 10 is held by the conductive terminals 30a and 30b and is housed in the hollow portion 21 of the case 20.

The corner portions at both ends of the piezoelectric vibrator element 10 abut the slopes of the concavities 32a and 32b of the conductive terminals 30a and 30b, respectively. Two electrodes 12 and 13 (FIG. 1) of the element 10 are connected to the corresponding conductive terminals 30a and 30b by means of an electrical connecting member 40 made of a conductive paint or the like. The connecting member 40 may be of a conductive paint, a creamy solder, or any other conductive adhesive agent. More specifically, the connecting member 40 is preferably of a fluid material at a normal temperature which solidifies by heating or any other processing.

FIGS. 5A to 5D are views which illustrate the manufacturing process of the embodiment shown in FIGS. 4A and 4B. Referring to FIGS. 5A to 5D, the manufacturing process of the embodiment will be described.

Figure 5A:
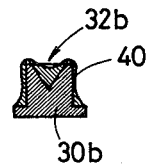
FIGS. 5A to 5D are views for explaining a manufacturing process of one embodiment of the present invention.
Figure 5B:
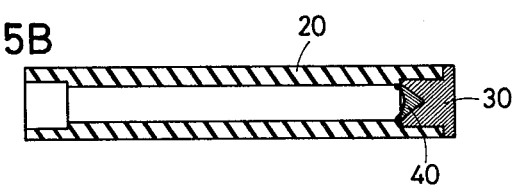
Figure 5C:
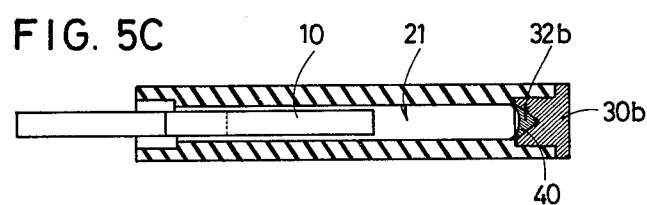

First, as shown in FIG. 5A. a conductive paint 40 is coated on a metallic terminal 30b. Then, as shown in FIG. 5B, the metallic terminal 30b is mounted onto the opening at one end of the case 20. Then, as shown in FIG. 5C, the piezoelectric vibrator element 10 is inserted from the opening at the other end of the case 20. The piezoelectric vibrator element 10 is adapted to abut on the concavity 32b of the metallic terminal 30b. Since the conductive paint 40 has been coated on the concavity 32b, the electrode 12 of the piezoelectric vibrator element 10 and the metallic terminal 30b are electrically connected.

Then the conductive paint 40 is coated on the metallic terminal 30a and the same is mounted onto the opening of the other end of the case 20. As a result, the electrode 13 of the piezoelectric vibrator element 10 and the metallic terminal 30a are electrically connected. Thus, a piezoelectric vibrator component implemented in a chip form, as shown in FIG. 5D, is provided.

Figure 5D:
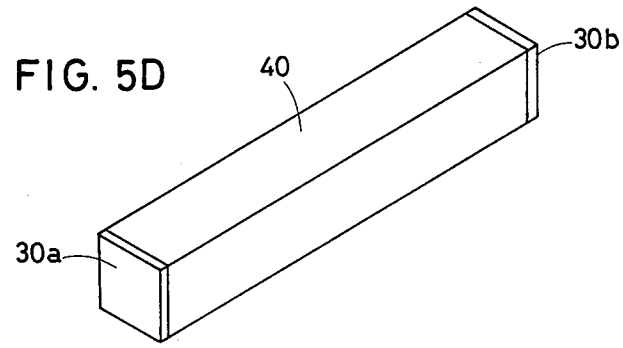

In the case where the chip-like piezoelectric vibrator component as shown in FIG. 5D is mounted in other circuits, the conductive terminals 30a and 30b are conductively adhered and fixed onto a printed circuit board, for example, directly by soldering.

As described in the foregoing, the above described embodiment eliminates the necessity of complicated steps such as soldering, required conventionally, in assemblage of the piezoelectric vibrator components and, therefore, assemblage can be mechanized and the production time can be considerably shortened. Furthermore, since the number of components is reduced as compared with the conventional one, the cost can be reduced. Furthermore, the outer geometry can be unified due to implementation in a chip form and at the same time reliability can be enhanced. Furthermore, the outer geometry can be made small sized as compared with the conventional structures.

Experiments have shown that one embodiment of the present invention can reduce the volume of the piezoelectric vibrator component to approximately 1/30 the volume of the conventional piezoelectric vibrator component shown in FIG. 2A, for example.

If a portion of either vibrator electrode is in contact with the case in a chip-like piezoelectric component, the resonance resistance is increased and minor spurious vibration could be caused between the resonance frequency and the anti-resonance frequency or in the vicinity thereof. This could cause a disadvantage where a chip-like piezoelectric vibrator component is used as a vibrator in an oscillating circuit or as a discriminator element of an FM circuit. However, the present invention avoids this problem because of the positioning portion defined by a concavity 32a, 32b is formed on the conductive terminal. More specifically, since the vibrating portion of the piezoelectric vibrator element is housed in the case at a location spaced apart from the case, an increase of the resonance resistance and occurrence of minor spurious vibration are prevented. Furtheremore, since a positioning portion for supporting or holding the element is formed on the terminal, mechanical stability of the element is enhanced.

Figure 6:
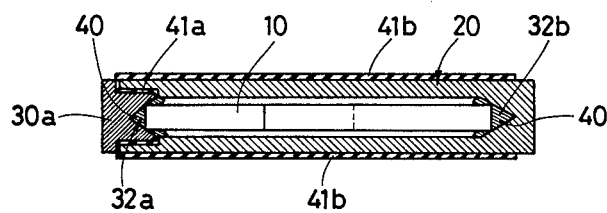
FIG. 6 is a sectional view showing another embodiment of the present invention.

FIG. 6 is a sectional view showing a modification of the above described embodiment. The above described embodiment has openings at both ends of the case 20. The present embodiment, however, has an opening only at one end, while the other end is closed. Since no conductive terminal cannot be mounted onto the other end of the case 20 of such shape, the entire case is formed using a conductive material. A concavity 32b of the same configuration as that of the concavity 32a of the conductive terminal 30a is formed on the other end of the conductive case 20 and a conductive paint 40 is coated thereon. Accordingly, even in the case of the embodiment being described, the piezoelectric vibrator element 10 is held by the concavities 32a and 32b. Meanwhile, an insulating material 41a is inserted between the terminal 30a and the case 20 so that the two electrodes of the element 10 are prevented from being electrically short-circuited and an insulating coating 41b is coated thereon except for the vicinity of the other end of the case 20.

Figure 7A:
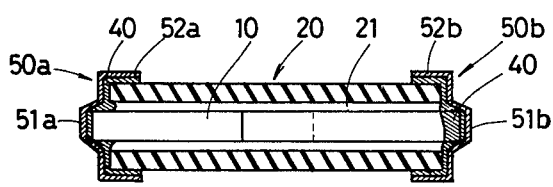
FIG. 7A is a sectional view of a further embodiment of the present invention.
Figure 7B:
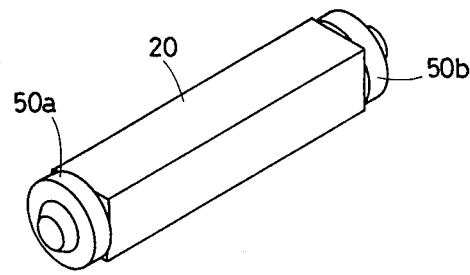
FIG. 7B is a perspective view of the embodiment shown in FIG. 7A.

FIG. 7A is a sectional view of yet another embodiment of the present invention and FIG. 7B is a perspective view of the embodiment shown in FIG. 7A. The piezoelectric vibrator element 10 of the embodiment of FIGS. 7A and 7B may comprise a conventional piezoelectric vibrator element as shown in FIG. 1. The piezoelectric vibrator element 10 is housed in a cylindrical case 20 made of synthetic resin, alumina, glass or the like. More specifically, the case 20 is of a square outer contour in section in a major portion and is of a circular outer contour in section at both end portions and has openings at both end surfaces and caps 50a and 50b serving as conductive terminals are mounted onto both end portions. The caps 50a and 50b are electrically connected to the electrodes 12 and 13 (FIG. 1) of the element 10 by means of a conductive connecting material 40 of such as a conductive paint, a creamy solder, or other type of conductive adhesive agent.

The caps 50a and 50b each comprise a first portion corresponding to the opening of the cylindrical case 20 and a second portion extending along the side surface of the case 20 from the first portion. Protrusions 51a and 51b protruding outwardly of the case 20 are formed on the first portions of the caps 50a and 50b, respectively. More specifically, the caps 50a and 50b are formed with a concavity therein. Meanwhile, since these caps 50a and 50b are formed from a blank of conductive material such as aluminum, copper or the like, such protrusions 51a and 51b can be readily formed by a well-known press molding process. Opposite ends of the element 10 engage the concavity formed by the protrusions 51a and 51b respectively.

In the above described embodiment the positioning portions or concavities were formed on both terminals or caps. However, the concavity may be formed only on one terminal. In such case, it follows that the element 10 is housed and held obliquely in the case 20. In such case, a portion of the withdrawing electrode formed at the other end of the element 10 is placed in contact with the inner wall of the case 20; however, the portion corresponding to the vibrator electrode formed approximately at the center of the element 10 will not be in contact with the inner wall of the case 20. More specifically, the vibrating portion of the element 10 is necessarily spaced apart from the inner wall of the case and no problem results.

Figure 8:
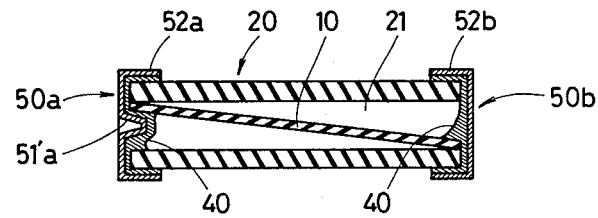
FIGS. 8 and 9 are sectional views showing still further embodiments of the present invention.

FIG. 8 is a sectional view showing another embodiment of the present invention. The embodiment in description is different from that shown in FIG. 7A in the configuration of the cap 50a. More specifically, although the embodiment shown in FIGS. 7A and 7B was provided with the offset portions for positioning by the protrusion 51a protruding outwardly of the case, the embodiment shown in FIG. 8 is formed with an offset portion by a concavity 51'a formed inwardly of the case 20. One end of the piezoelectric vibrator element 10 is held at the offset portion formed by the concavity 51'a. This embodiment also necessarily has a certain space with respect to the inner wall of the case 20, as far as the vibrator electrode portion formed approximately at the center of the piezoelectric vibrator element 10 is concerned.

Figure 9:
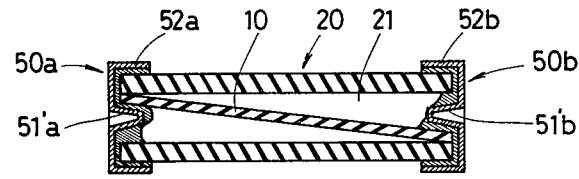

FIG. 9 is a sectional view showing a further embodiment of the present invention. The embodiment in description has a concavity 51'b formed on the cap 50b extending inwardly of the case 20, as in the case of the cap 50a. As a result, the positioning of the piezoelectric vibrator element 10 becomes firm and mechanical stability is further enhanced.

Figure 10A:
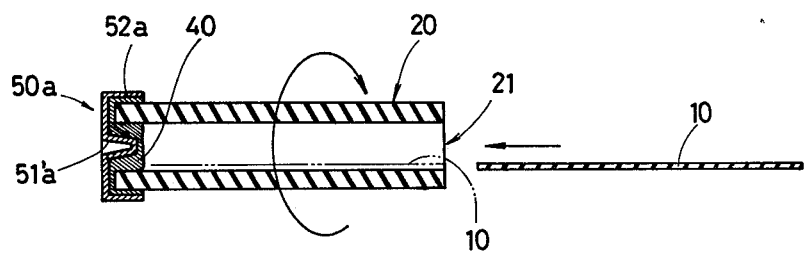
FIGS. 10A and 10B are views showing the process of manufacturing the chip-like piezoelectric vibrator component shown in FIG. 9.
Figure 10B:
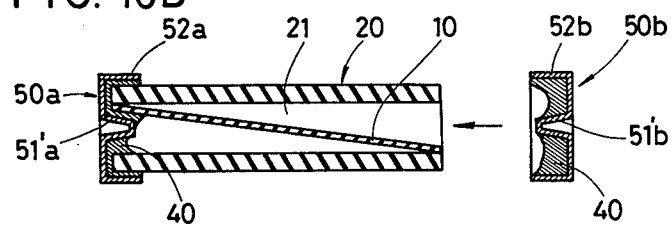

The chip-like piezoelectric vibrator component shown in FIG. 9 can be fabricated in accordance with the steps shown in FIGS. 10A and 10B. A cylindrical case 20, open at both ends, is prepared and a cap 50a having a concavity 51'a is fixed onto one end of the case 20. A solder cream or a conductive paint 40 is coated in advance. Then, the piezoelectric element 10 shown in FIG. 1 is inserted through the other open end, of the case 20, so that it is positioned as shown by the two dotted line in FIG. 10A.

The case is then rotated 180° about the longitudinal axis as the rotation axis as shown in FIG. 10A, whereby the other end of the piezoelectric vibrator element 10 falls to be in contact with the inner wall of the case due to its own weight, as shown in FIG. 10B. Thereafter, the cap 50b, coated in advance with the conductive paste or the conductive paint 40, is placed onto the other end of the case 20 completing the embodiment shown in FIG. 9.

Figure 11:
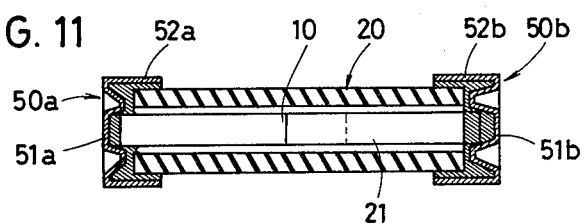
FIG. 11 is a sectional view of still a further embodiment of the present invention.

FIG. 11 is a sectional view showing still a further embodiment of the present invention. This embodiment is also adapted to support the piezoelectric vibrator element 10 in the case 20 in in a position parallel to the case, as in the embodiment shown in FIG. 7A. The caps 50a and 50b are formed with the protrusions 51a and 51b protruding outwardly of the case. However, the protrusions 51a and 51b are selected to be lower than the height of the periphery of the caps 50a and 50b. According to the embodiment in description, the piezoelectric vibrator element 10 can be supported parallel to the case 20, as done in the embodiment shown in FIG. 7A. In addition, since the protrusions 51a and 51b are positioned inwardly of the periphery of the cap, the embodiment can easily be handled as is the case of the embodiments shown in FIGS. 4A, 8 and 9.

Figure 12:
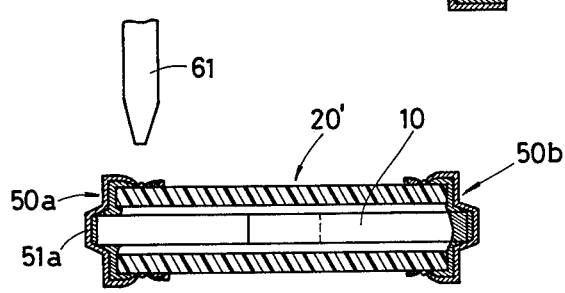
FIG. 12 is a view showing one example of mechanical fixing of a cap.

FIG. 12 is a view showing still a further embodiment of the present invention. All of the embodiments so far described do not employ any particular means other than utilizing an adhering substance of such as a conductive paint or a solder for mechanically fixing the caps 50a and 50b to the case 20. However, in certain circumstances, the caps 50a and 50b can become separated from the case due to a external stresses, with the result that the chip-like piezoelectric vibrator component could be damaged. To overcome this problem, the embodiment shown in FIG. 12 includes a piezoelectric vibrator element 10 inserted into a resin case 20 whose ends are covered by caps 50a and 50b having a conductive paint located therein. A portion of the caps 50a and 50b is then punched by punches 61 and 62 before the conductive paint solidifies, and a second portion of the caps 50a and 50b extending along the case 20 is broken, so that "flash" caused at that time may make inroad into the resin case 20. By doing so, the resin case 20 and the caps 50a and 50b can be mechanically stably coupled and fixed.

Figure 13:
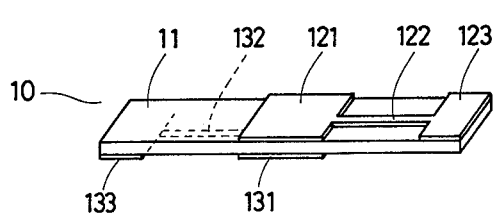
FIG. 13 is a perspective view showing a further example of a piezoelectric element for use in the present invention.

Meanwhile, the present invention may also employ such an element as shown in FIG. 13. The piezoelectric vibrator element 10 comprises a piezoelectric plate 11 made of ceramic or the like, for example, and opposing vibrator electrodes 121 and 131 are formed on respective surfaces, of the plate. The vibrator electrodes 121 and 131 cooperate with each other to cause a thickness sliding vibration, width sliding vibration, width longitudinal vibration and any other predetermined mode vibrations on the piezoelectric plate. These vibrator electrodes 121 and 131 are connected to withdrawing electrodes 123 and 133 by means of the electrodes 122 and 132, respectively.

In the case where such element 10 is employed, the withdrawing electrodes 123 and 133 would be electrically connected to the conductive terminals, respectively.

Figure 14A:
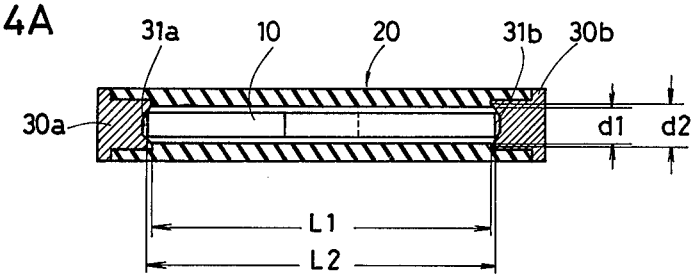
FIGS. 14A amd 14B are views showing a dimensional relation of the piezoelectric vibrator element and the case and the conductive terminals (caps)
Figure 14B:
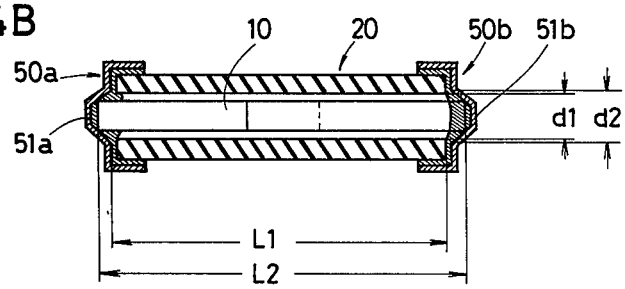

In the case of the embodiment shown in FIGS. 4A and 7A, the dimensions of various portions are preferably selected as shown in FIGS. 14A and 14B. More specifically, assuming that the internal diameter of the case 20 is d1, the opening diameter of a conical or frustum-conical concavity of the conductive terminals 30a, 30b or 50a, 50b is d2, the distance between the openings of the concavities of both terminals is L1, and the length of the piezoelectric plate is L2, it is further assumed that $d2 \geq d1$ and $L2 > L1$.

By ensuring that $d2 \geq d1$, the piezoelectric vibrator element 10 can be effectively prevented from abutting against the opening portion of the terminal and hence from being damaged. Furthermore, by employing $L2 > L1$, a necessary space can be secured between the piezoelectric vibrator element 10 and the inner wall of the case 20 at the upper and lower portions of the element 10.

Figure 15:
FIG. 15 is a sectional view showing a further example of the cap.

FIG. 15 is a sectional view showing another example of the cap for use in the present invention. The embodiment shown comprises a cap 50a including a protrusion 51a protruding outwardly of the case as seen in the embodiment shown in FIG. 7A. An aperture 53a is formed at the first portion of the cap 51a, i.e. a portion corresponding to the end surface of the case 20. The aperture 53a is used for injecting a molten solder serving as a conductive adhesive material for electrically connecting the electrodes of the piezoelectric vibrator element 10 onto the cap. More specifically, although the embodiments so far shown utilized a conductive paint or a creamy solder for the electrodes of the piezoelectric vibrator element 10 and the caps 50a and 50b, by utilizing such a cap as shown in the embodiment shown in FIG. 15, the electrodes of the piezoelectric vibrator element and the cap can be conductively connected using a solder molten after an assemblage of the piezoelectric vibrator element 10 and the case 20.

Figure 16:
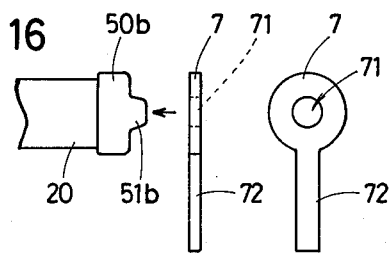
FIG. 16 is a view showing one example of connection to a withdrawing terminal.

FIG. 16 is a view showing a preferred embodiment of the present invention. The embodiment shown has a protrusion 51b protruding outwardly of the case 20 formed on the cap 50b, as seen in the embodiment shown in. FIG. 7A. By utilizing such cap 50b, the connecting terminal 7 can be directly connected to the protrusion 51b. More specifically, the connecting terminal 7 comprises an approximate circular head and a leg 72 extending therefrom. An aperture 71 having substantially the same diameter as that of the protrusion 51b of the cap is formed on the head, so that the protrusion 51b just fits into the aperture 71 of the connecting terminal 7. By jointing the cap 50b and the head of the connecting terminal 7 by the use of for example a solder, a piezoelectric vibrator component having connecting terminals can be simply structured.

Figure 17:
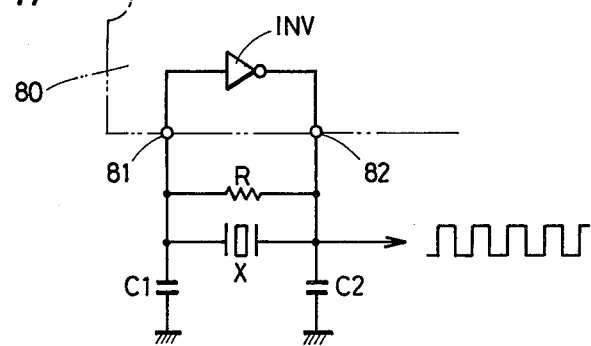
FIG. 17 is a schematic diagram showing one example of an oscillating circuit utilizing a chip-like piezoelectric vibrator component in accordance with the present invention.

FIG. 17 is a schematic diagram showing one example of an oscillating circuit utilizing a chip-like piezoelectric vibrator component in accordance with the present invention. An integrating circuit 80 includes an inverter INV, which is connected to the terminals 81 and 82 of the integrated circuit 80. A chip-like piezoelectric vibrator component X and a feedback resistor R constituting an oscillator in cooperation with the inverter INV are connected in parallel to the terminals 81 and 82, which are connected through capacitors C1 and C2. The capacitors C1 and C2 are load capacitances, which, together with a circuit including the vibrator X and the inverter INV, provide a condition for positive feedback. The feedback resistor R is inserted for the purpose of supressing self-excited oscillation of an amplifier included in the inverter and is usually selected to be 500 KΩ to 10 MΩ. An oscillation output is obtained from the output of the vibrator X, i.e. the terminal 82.

Figure 18A:
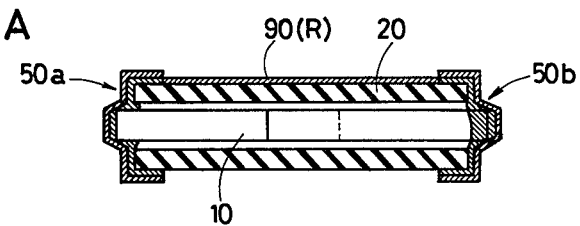
FIG. 18A is a sectional view of still a further embodiment of the present invention.
Figure 18B:
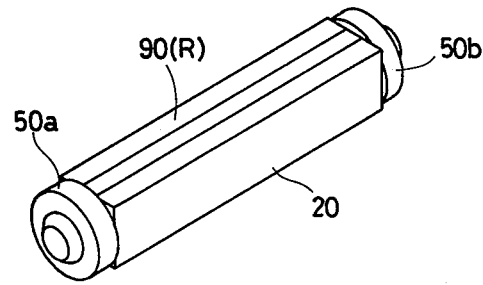
FIG. 18B is a perspective view of the embodiment shown in FIG. 18A.
Figure 19:
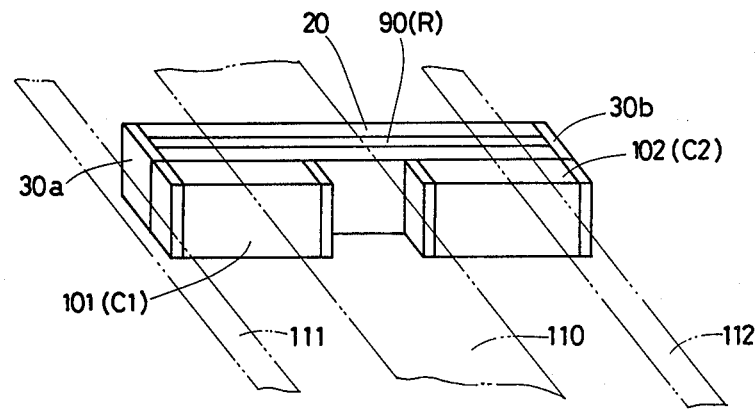
FIG. 19 is a perspective view showing still a further embodiment of the present invention.

Embodiments shown in FIGS. 18A and 18B and 19 are adapted to combine a resistor or a capacitor constituting such an oscillating circuit with a chip-like piezoelectric vibrator component, i.e. a vibrator X in a composite form.

A piezoelectric vibrator element 10 is housed in a cylindrical case 20 made of a material of non-conduction of such as glass, ceramic or the like and resistant to a high temperature, whereupon caps 50a and 50b are covered onto both ends of the cylindrical case 20. Meanwhile, it is a matter of course that a housing or supporting structure of the piezoelectric vibrator element 10 may employ any of the previously described ones apart from that shown in this embodiment.

A resistive film 90 of an oxide film, carbon or the like, for example, is formed on the side surface of the cylindrical case 20, whereby a feedback resistor R to be connected in parallel with the inverter INV and thus with the vibrator X is formed integrally of the vibrator X.

Meanwhile, the resistive film 90 can be formed by coating an oxide film, carbon or the like and by baking the same at high temperature, for example. Although the resistance value of the resistive film 90 may be adjusted, no particular adjustment is required in consideration of the range of 500 KΩ to 10 MΩ of the above described necessary resistance value.

The embodiment shown in FIGS. 18A and 18B enables an implementation of a vibrator and a resistor in a composite form without any particular additional steps. Furthermore, since the resistive film is of a thickness of say about 10 to 60 μm, there is no problem of increasing the geometry of a completed chip-like piezoelectric vibrator component.

An embodiment shown in FIG. 19 aims to implement a composite form further including the capacitors C1 and C2.

Referring to FIG. 19, a piezoelectric element such as that shown in FIG. 1, is housed in an angular case 20. Metallic terminals 30a and 30b are covered on both ends of the case 20. A positioning structure (an offset portion) for an element to be housed in the case 20 is formed on the metallic terminals or caps 30a and 30b in an arbitrary manner. A resistive film 90 is formed on the surface of the case 20. Two chip-like capacitors 101 and 102 are fixed on the side surface of the case 20. The chip-like capacitors 101 and 102 correspond to the capacitors C1 and C2, respectively, shown in FIG. 17. Capacitor electrodes are formed on both ends of the chip-like capacitors 101 and 102, respectively. Meanwhile, an integral implementation of these chip-like capacitors 101 and 102 and the case 20 is achieved by pasting them with an adhesive agent, for example. Then the integral chip-like piezoelectric vibrator component is coupled to printed patterns 110, 111 and 112 of a printed circuit board, not shown, for example. More specifically, one capacitor electrode of each of the chip-like capacitors 101 and 102 is connected to the ground pattern 110, the cap 30a and the other electrode of the chip-like capacitor 101 are connected to the patterns 111 and 112 coupled to the terminals 81 and 82, respectively, of the integrated circuit 80 shown in FIG. 17, for example, and the other electrode of the chip-like capacitor 102 is connected to the cap 30b.

By way of example, a chip-like piezoelectric vibrator component housed in the angular case 20 may be 2.2 mm in thickness, 2.2 mm in width and 6.9 mm in length and the chip-like capacitors 101 and 102 may be of a size of 1.6 mm in width and 3.2 mm in length.

A resistive film formed on the side surface of the case 20 in the embodiments shown in FIGS. 18A and 18B and 19 may be formed on the whole side surface and the position where the same is formed may be arbitrary, provided that the same is coupled to the caps 30a and 30b.

By doing so, not only the vibrator but also a resistor or a capacitor constituting an oscillating circuit or the like together with the vibrator can be implemented in an integral form, whereby the same is compact and is easy of handling while the degree of integration is enhanced.

Meanwhile, although in the above described embodiments a cylindrical case and a cap employed a circular cap for an angular case, both may be circular or both may be angular.

Furthermore, although the second portion of the cap is fitted along the outer side surface of the case in any of the above described embodiments, the structure may be such that the same may be fitted along the inner side surface (inner wall) of the case.

Furthermore, the caps 50a and 50b for use in the embodiments shown in FIGS. 7A, 7B to 11 may be arbitrarily combined and the structured forming an offset portion should not be limited to the shape of these embodiments, as a matter of course.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip-like piezoelectric vibrator component, comprising:

a piezoelectric vibrator element including an elongated piezoelectric plate having first and second opposing electrodes formed on opposite main surfaces of said piezoelectric plate, said first and second opposing electrodes at least partially overlapping one another, said piezoelectric vibrator element exhibiting a vibration with energy trapped in the longitudinal direction thereof;

first and second withdrawing electrodes for respectively connecting said first and second opposing electrodes to opposite ends of said piezoelectric plate;

an axially elongated case formed of an insulating material and having first and second openings formed at opposite ends thereof for housing said piezoelectric vibrator element in a hollow portion of said case;

first and second conductive terminal members mounted on said first and second openings, respectively, each of said conductive terminals having a recess formed therein which is defined, in part, by a convex portion of said conductive terminals which protrude inwardly of said case, said recesses defining positioning members which cooperate with each other to position said vibrator element such that a space is formed between a portion of said opposing electrodes and the inner wall of said case when said piezoelectric vibrator element is housed in said case; and first and second connecting members electrically connecting said first and second conductive terminals to said first and second withdrawing electrodes, respectively.

2. A chip-like piezoelectric vibrator component, comprising:

a piezoelectric vibrator element including an elongated piezoelectric plate having first and second opposing electrodes formed on opposite main surfaces of said piezoelectric plate, said first and second opposing electrodes at least partially overlapping one another, said piezoelectric vibrator element exhibiting a vibration with energy trapped in the longitudinal direction thereof;

first and second withdrawing electrodes for respectively connecting said first and second opposing electrodes to opposite ends of said piezoelectric plate;

an axially elongated case formed of an insulating material and having first and second openings formed at opposite ends thereof for housing said piezoelectric vibrator element in a hollow portion of said case;

first and second conductive terminals mounted on said first and second openings, respectively, said conductive terminals each having a recess formed therein which defines a positioning member which positions said vibrator element in said case, the inner diameter of said case being d1 and the opening diameter of each of said recesses being d2 and $d2 \geq d1$, said positioning members positioning said piezoelectric vibrator element such that a space is formed between a portion of said opposing electrodes and the inner wall of said case when said piezoelectric vibrator element is housed in said case; and first and second connecting members electrically connecting said first and second conductive terminals to said first and second withdrawing electrodes, respectively.

3. A piezoelectric vibrator component in accordance with claim 2, wherein the distance between the openings of said recesses of said conductive terminals is L1 and the length of said piezoelectric plate is L2 and $L2 > L1$.

4. A piezoelectric vibrator component in accordance with any of the preceding claims 1, 2, or 3, wherein each of said conductive terminals is made of a blank of a conductive material and defines a cap for covering its respective said opening, said cap comprising a first portion corresponding to its respective said opening and a second portion extending along the side surface of said case from said first portion, and said positioning member is formed on said first portion.

5. A piezoelectric vibrator component in accordance with claim 4, wherein said case is made of a resin material, and wherein said component further comprises a caulking portion formed on said second portion for mechanically fixing said cap onto said case by caulking said second portion and the side surface of said resin case.

* * * * *